United States Patent
Hietala et al.

(10) Patent No.: US 10,187,019 B1
(45) Date of Patent: Jan. 22, 2019

(54) PHASED ARRAY ANTENNA SYSTEM

(71) Applicant: Qorvo US, Inc., Greensboro, NC (US)

(72) Inventors: Alexander Wayne Hietala, Phoenix, AZ (US); Nadim Khlat, Cugnaux (FR); Michael F. Zybura, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/935,081

(22) Filed: Mar. 26, 2018

(51) Int. Cl.
| | |
|---|---|
| H03F 1/52 | (2006.01) |
| H03F 3/19 | (2006.01) |
| H03F 3/24 | (2006.01) |
| H04B 1/04 | (2006.01) |
| H01Q 21/06 | (2006.01) |

(52) U.S. Cl.
CPC ............ *H03F 1/52* (2013.01); *H01Q 21/061* (2013.01); *H03F 3/19* (2013.01); *H03F 3/245* (2013.01); *H04B 1/04* (2013.01); *H03F 2200/129* (2013.01); *H03F 2200/426* (2013.01); *H03F 2200/451* (2013.01); *H03F 2200/462* (2013.01); *H03F 2200/471* (2013.01)

(58) Field of Classification Search
CPC ... H03F 1/52; H03F 3/19; H03F 3/245; H03F 2200/129; H03F 2200/426; H03F 2200/451; H03F 2200/462; H03F 2200/471; H01Q 21/061; H04B 1/04
See application file for complete search history.

(56) References Cited

U.S. PATENT DOCUMENTS

| | | | |
|---|---|---|---|
| 7,486,936 B2* | 2/2009 | Kappes | H03F 1/523 327/321 |
| 7,693,494 B2* | 4/2010 | Litmanen | H03F 1/0205 330/284 |
| 7,792,506 B1* | 9/2010 | Wright | H03F 1/0216 330/250 |
| 7,873,335 B2* | 1/2011 | Hug | H03F 1/52 455/115.1 |
| 8,154,345 B2* | 4/2012 | Andrys | H03F 1/0261 330/279 |

(Continued)

OTHER PUBLICATIONS

Johannsen, U. et al., "Substrate Loss Reduction in Antenna-on-Chip Design," 2009 IEEE Antennas and Propagation Society International Symposium, 2009, IEEE, 4 pages.

*Primary Examiner* — Pablo Tran
(74) *Attorney, Agent, or Firm* — Withrow & Terranova, P.L.L.C.

(57) ABSTRACT

A phased array antenna system having a plurality of antenna elements arranged into an array is disclosed. Each of a plurality of amplifier circuitries has an output terminal coupled to a corresponding one of the plurality of antenna elements and includes a power amplifier having a control terminal coupled to an input terminal. The power amplifier has a first current terminal coupled to the output terminal and a second current terminal coupled to a fixed voltage node. Further included in each of the plurality of amplifier circuitries is a current limiter having a bias terminal coupled to the control terminal of the power amplifier to adjust a bias point of the power amplifier to limit current flowing through the first current terminal and the second current terminal to within a predetermined current range. Some embodiments also include a voltage limiter to limit voltage amplitude at the output terminal.

10 Claims, 6 Drawing Sheets

(56) References Cited

U.S. PATENT DOCUMENTS

| | | |
|---|---|---|
| 9,197,162 B2 | 11/2015 | Chiron et al. |
| 9,621,118 B2 * | 4/2017 | Ripley ...................... H03F 1/56 |
| 9,948,242 B2 * | 4/2018 | Varner .................. H03F 1/0233 |
| 2015/0255368 A1 | 9/2015 | Costa |
| 2016/0134014 A1 | 5/2016 | Hietala et al. |
| 2017/0317697 A1 * | 11/2017 | Motoi ...................... H04B 1/04 |

* cited by examiner

PHASED ARRAY ANTENNA SYSTEM

RELATED APPLICATIONS

This application is related to U.S. patent application Ser. No. 14/933,552, filed Nov. 5, 2015, which claims priority to provisional patent application Ser. No. 62/077,481, filed Nov. 10, 2014, the disclosures of which are hereby incorporated herein by reference in their entireties.

FIELD OF THE DISCLOSURE

The present disclosure relates generally to protecting power amplifiers that drive phased array antenna systems employed in telecommunications equipment such as smartphones.

BACKGROUND

Development of fifth-generation (5G) wireless networks with higher modulation bandwidth and data rates has increased demands on cellular handset technology. For example, phased array antennas are envisioned as key components needed to meet these increased demands. However, a difficult problem has arisen in protecting power amplifiers that drive phased array antennas. The problem is at least caused in part by chaotic antenna impedance fluctuations as a user varies the placement of his body relative to a phased array antenna included in a cellular handset. The chaotic antenna impedance fluctuations may in turn cause voltage standing wave ratios (VSWRs) that are high enough to damage radio frequency power amplifiers driving the phased array antenna. What is needed is a phased array antenna system that protects radio frequency power amplifiers that drive phased array antennas from damage that may result from high VSWRs.

SUMMARY

A phased array antenna system having a plurality of antenna elements arranged into an array is disclosed. Each of a plurality of amplifier circuitries has an output terminal coupled to a corresponding one of the plurality of antenna elements and includes a power amplifier having a control terminal coupled to an input terminal. The power amplifier has a first current terminal coupled to the output terminal and a second current terminal coupled to a fixed voltage node. Further included in each of the plurality of amplifier circuitries is a current limiter having a bias terminal coupled to the control terminal of the power amplifier to adjust a bias point of the power amplifier to limit current flowing through the first current terminal and the second current terminal to within a predetermined current range. Some embodiments also include a voltage limiter to limit voltage amplitude at the output terminal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
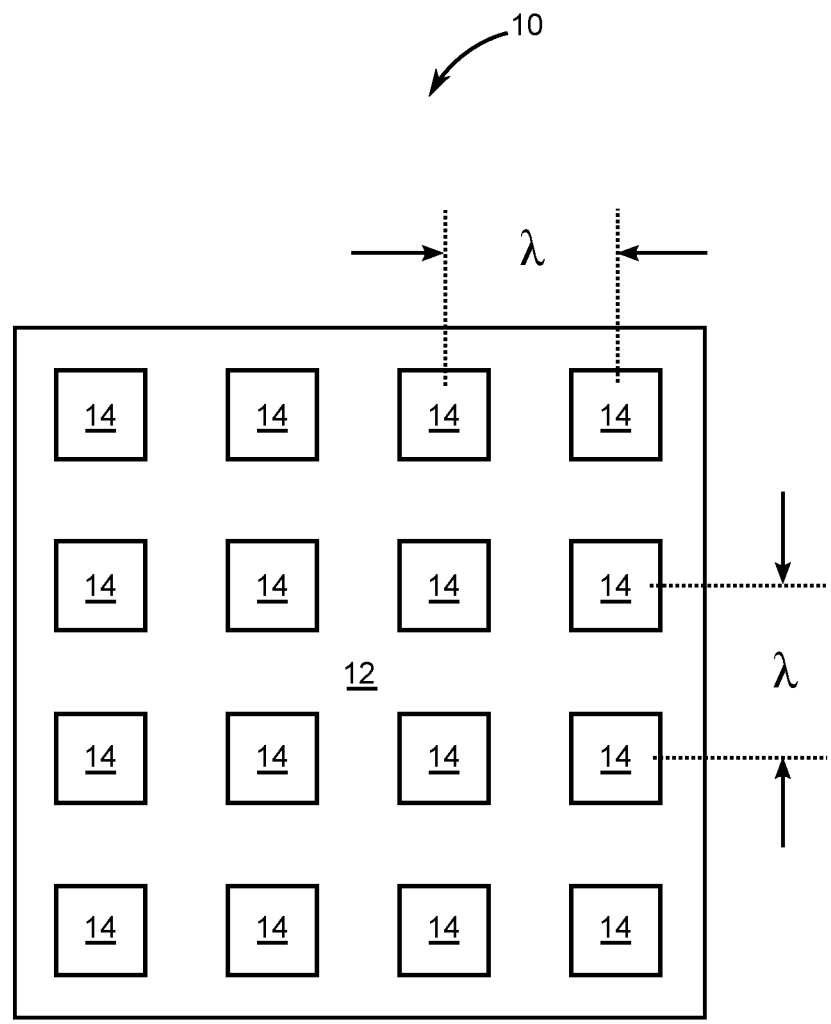
FIG. 1 is a diagram of a related-art phased array antenna that may be included in a fifth-generation cellular handset.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a diagram of a related-art phased array antenna 10 that may be included in a fifth-generation (5G) cellular handset. The related-art phased array antenna 10 has a substrate 12 onto which a plurality of antenna elements 14 are arranged into a rectangular array. Centers of the antenna elements 14 are spaced apart by fractions of a wavelength λ of a desired emission from the related-art phased array antenna 10. In this case, the related-art phased array antenna 10 is a 5G millimeter-wave array. Compared with a typical 4G antenna system, there is relatively little loss of power between a power amplifier driving the related-art phased array antenna 10 and the related-art phased array antenna 10 because there are typically no intervening lossy elements present. As a result, power amplifiers driving the plurality of antenna elements 14 are vulnerable to damage from excessive current and voltage when the plurality of antenna elements 14 is obstructed such that a poor (i.e., high) standing wave ratio (SWR) is experienced by the related-art phased array antenna 10. Therefore, a phased array antenna system that protects power amplifiers driving the plurality of antenna elements 14 from damage that may result from high SWRs is needed.

Figure 2:
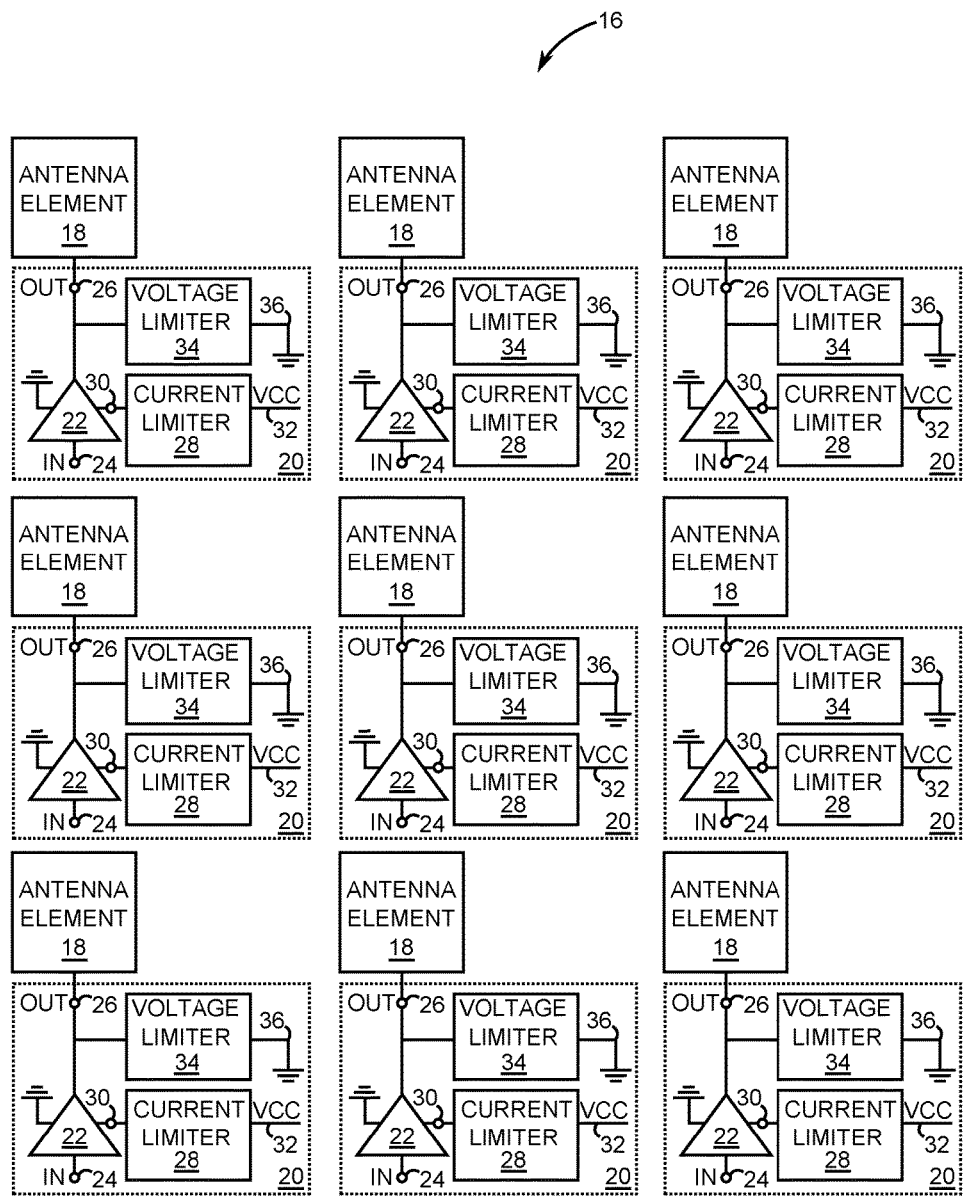
FIG. 2 is a diagram of an embodiment of a phased array antenna system 16 that protects power amplifiers driving the plurality of antenna elements 14 from damage that may result from standing wave ratios having high values.

In this regard, FIG. 2 is a diagram of an embodiment of a phased array antenna system 16 that protects power amplifiers driving a plurality of antenna elements 14 (FIG. 1) from damage that may result from high SWRs. The phased array antenna system 16 has an array of antenna elements 18 and a plurality of amplifier circuitries 20. Each of the plurality of amplifier circuitries 20 has a power amplifier 22 coupled between an input terminal 24 for receiving a radio frequency (RF) signal to be amplified and an output terminal 26 coupled to a corresponding one of the array of antenna elements 18 for transmitting an amplified version of the RF signal from the corresponding one of the array of antenna elements 18.

Further included in each of the plurality of amplifier circuitries 20 is a current limiter 28 having a bias terminal 30 coupled to the power amplifier 22. The current limiter 28 may be supplied from a supply voltage node 32 labeled VCC that provides power to the power amplifier 22. In general, the current limiter 28 is configured to actively lower current flowing through the power amplifier 22 whenever the current limiter 28 senses that current flowing through the power amplifier 22 exceeds a predetermined current range. For example, in at least one embodiment the predetermined current range is from 5 A to 5.5 A. However, it is to be understood that the predetermined current range can be different for different power amplifier technologies.

Each of the plurality of amplifier circuitries 20 may also include a voltage limiter 34 coupled between the output terminal 26 and ground. In general, the voltage limiter 34 is configured to limit voltage across the power amplifier 22 whenever the voltage across the power amplifier 22 exceeds a predetermined voltage level.

Figure 3:
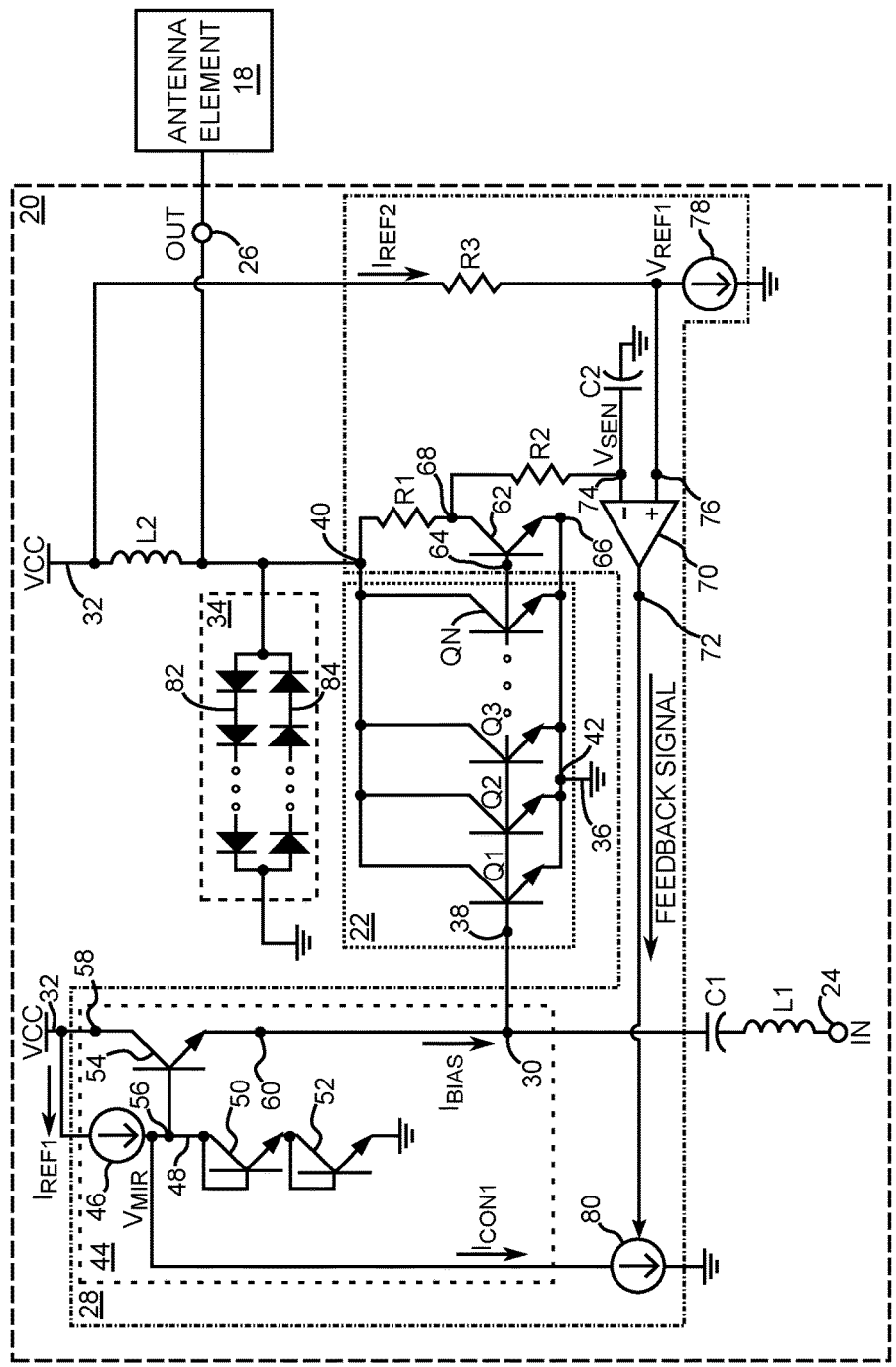
FIG. 3 is a schematic of a first embodiment of a single-ended version of each one of the plurality of amplifier circuitries having a current limiter and a voltage limiter in accordance with the present disclosure.

FIG. 3 is a schematic of a first embodiment of a single-ended version of each one of the plurality of amplifier circuitries 20 detailing versions of the power amplifier 22, the current limiter 28, and the voltage limiter 34 in accordance with the present disclosure. In this exemplary embodiment, the power amplifier 22 is made up of a plurality of bipolar junction transistors Q1, Q2, Q3, through QN coupled in parallel and configured to amplify RF signals having wavelengths between 3 centimeters and 15 centimeters. The power amplifier 22 has a control terminal 38 coupled to the bias terminal 30. The control terminal 38, in this exemplary embodiment, is also coupled to the input terminal 24 through a first capacitor C1 and a first inductor L1 coupled in series with first capacitor C1 thereby forming a resonant circuit. The power amplifier 22 has a first current terminal 40 coupled to the output terminal 26 and a second current terminal 42 coupled to the fixed voltage node 36, which in this exemplary embodiment is at ground potential. The output terminal 26 is in turn coupled to a corresponding one of the array of antenna elements 18. In this exemplary embodiment, the first current terminal 40 is also coupled to the supply voltage node 32 through an RF choke inductor L2.

In the exemplary embodiment of FIG. 3, the current limiter 28 includes bias circuitry 44 that provides an operating point bias for the power amplifier 22. In this example, a first current source 46 is configured to generate a mirror voltage $V_{MIR}$ at a first reference node 48 of a double diode stack made up of a first diode-connected transistor 50 coupled in series with a second diode-connected transistor 52. During operation, the mirror voltage $V_{MIR}$ is produced as a portion of a first reference current $I_{REF1}$ flows through the first diode-connected transistor 50 and the second-diode connected transistor 52. A bias transistor 54 has a first base terminal 56 coupled to the first reference node 48, a first collector terminal 58 coupled to the supply voltage node 32, and a first emitter terminal 60 coupled to the bias terminal 30. In operation, a direct current (DC) bias current $I_{BIAS}$ that is emitted from the first emitter terminal 60 establishes an operating point for the power amplifier 22.

The current limiter 28 of the exemplary embodiment of FIG. 3 also includes a sense transistor 62 having a second base terminal 64 coupled to the control terminal 38 of the power amplifier 22. A second emitter terminal 66 is coupled to the fixed voltage node 36, which in this case is at ground potential. A second collector terminal 68 is coupled through a first resistor R1 to the first current terminal 40 of the power amplifier 22.

Further included is a first comparator 70 having a feedback output terminal 72, an inverting input terminal 74, and a non-inverting input terminal 76. A second resistor R2 couples the inverting input terminal 74 to the second collector terminal 68 of the power amplifier 22. A second capacitor C2 couples between the inverting input terminal 74 and ground. The second resistor R2 and the second capacitor C2 realize a low-pass filter that during operation provides a sense voltage $V_{SEN}$ at the inverting input terminal 74. During operation, the sense voltage $V_{SEN}$ is a DC voltage that is proportional to the RF signal voltage at the first current terminal 40 with respect to the fixed voltage node 36.

Also, in the exemplary embodiment, a second current source 78 is coupled between the non-inverting input terminal 76 and ground. A third resistor R3 couples the non-inverting input terminal 76 and second current source 78 to the supply voltage node 32. During operation a first reference voltage $V_{REF1}$ is applied to the non-inverting input terminal 76 as a second reference current $I_{REF2}$ flows through the third resistor R3.

Further included is a third current source 80 that is coupled between the first reference node 48 and ground. The third current source 80 is controlled by a feedback signal output from the feedback output terminal 72. The feedback signal may be either current or voltage depending on the type of controlled current source the third current source 80 is, which may be either a current-controlled type or a voltage-controlled type. Either type of controlled current source is employable with the present disclosure.

During operation, excessive current flow through the power amplifier 22 causes collector voltage of the sense transistor 62 to drop and result in the sense voltage $V_{SEN}$ dropping below the first reference voltage $V_{REF1}$. In response, the feedback signal output from the feedback output terminal 72 transitions from a lower value to a higher value. The higher value of the feedback signal causes a control current $I_{CON1}$ that flows through the third current source 80 to increase. In turn, the mirror voltage $V_{MIR}$ decreases as a smaller portion of the first reference current $I_{REF1}$ flows through the first diode-connected transistor 50 and the second diode-connected transistor 52. In response to the lower mirror voltage $V_{MIR}$, the bias transistor 54 lowers the bias current $I_{BIAS}$, which lowers the operating point of the power amplifier 22 to limit the current flowing through the power amplifier 22 to a predetermined safe level. The value to which the current flowing through the power amplifier 22 is limited is relatively easily set by the resistance value chosen for the third resistor R3.

In the exemplary embodiment of FIG. 3, the voltage limiter 34 is made up of a first branch 82 of series-connected diodes coupled in anti-parallel with a second branch 84 of series-connected diodes. Each diode provides from 0.5 V to 0.7 V of voltage drop. In at least one embodiment, a number of diodes selected for each of the first branch 82 and the second branch 84 is nine diodes. Therefore, during operation, in that particular embodiment, a maximum voltage across the power amplifier 22 from the first current terminal 40 to the second current terminal 42 is limited to from 4.5 V to 6.3 V.

Figure 4:
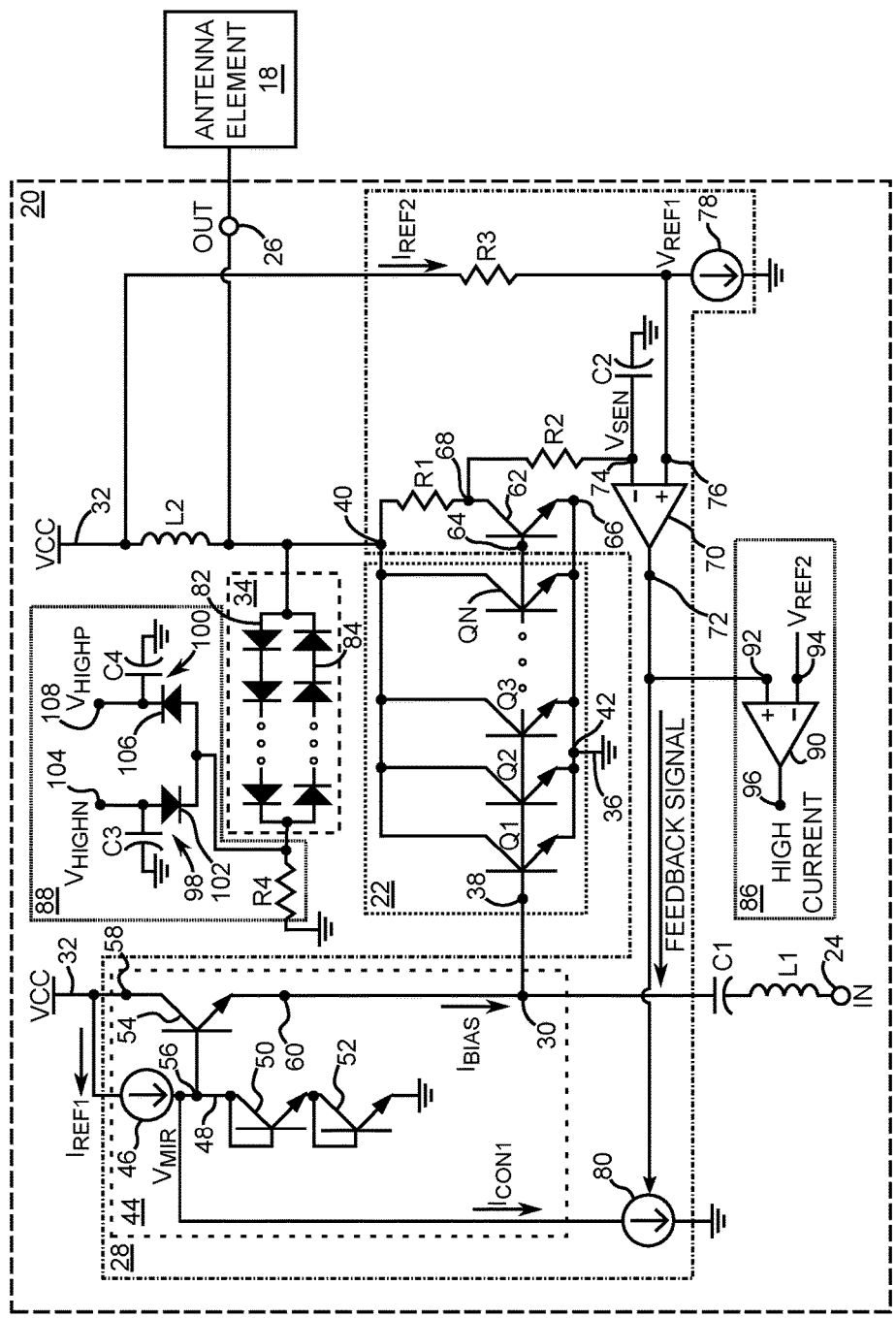
FIG. 4 is a schematic of a second embodiment of a single-ended version of each one of the plurality of amplifier circuitries that further includes an overcurrent detector and an overvoltage detector in accordance with the present disclosure.

FIG. 4 is a schematic of a second embodiment of a single-ended version of each one of the plurality of amplifier circuitries 20 that further include an overcurrent detector 86 and an overvoltage detector 88. In the exemplary embodiment of FIG. 4, the overcurrent detector 86 includes a second comparator 90 having a second non-inverting input terminal 92 coupled to the feedback output terminal 72 and a second inverting input terminal 94 that receives a second reference voltage $V_{REF2}$ and an overcurrent flag terminal 96. The second reference voltage $V_{REF2}$ is a fixed voltage having a voltage level set to a value that causes the second comparator 90 to output a high current flag signal to external circuitry if current flowing through the power amplifier 22 becomes excessive during operation.

In the exemplary embodiment of FIG. 4, the overvoltage detector 88 includes a fourth resistor R4 coupled between the voltage limiter 34 and ground. A relatively small sample of RF voltage appearing at the output terminal 26 appears across the fourth resistor R4 during operation if excessive voltage is limited by the voltage limiter 34. A negative rectification circuit 98 and a positive rectification circuit 100 are coupled from a node between the fourth resistor R4 and the voltage limiter 34 to ground. In the exemplary embodiment of FIG. 4, the negative rectification circuit 98 is made up of a first rectifier diode 102 coupled in series with a third capacitor C3. A high negative voltage flag signal $V_{HIGHN}$ is output from negative flag terminal 104 at a node between the first rectifier diode 102 and the third capacitor C3. During operation a negative DC voltage appears across the third capacitor C3 and thus appears at the negative flag terminal 104 that is available to external circuitry. Moreover, the positive rectification circuit 100 is made up of a second rectifier diode 106 coupled in series with a fourth capacitor C4. A high positive voltage flag signal $V_{HIGHP}$ is output from positive flag terminal 108 at a node between the second rectifier diode 106 and the fourth capacitor C4. During operation a positive DC voltage appears across the fourth capacitor C4 and thus appears at the positive flag terminal 108. External circuitry may respond to any or all of the high current signal flag, the high negative voltage flag signal $V_{HIGHN}$, and the high positive voltage flag signal $V_{HIGHP}$ to take further action to protect the power amplifier 22 and/or take some other action that enhances performance of a wireless communication device employing one or more of the phased array antenna systems 16.

Figure 5:
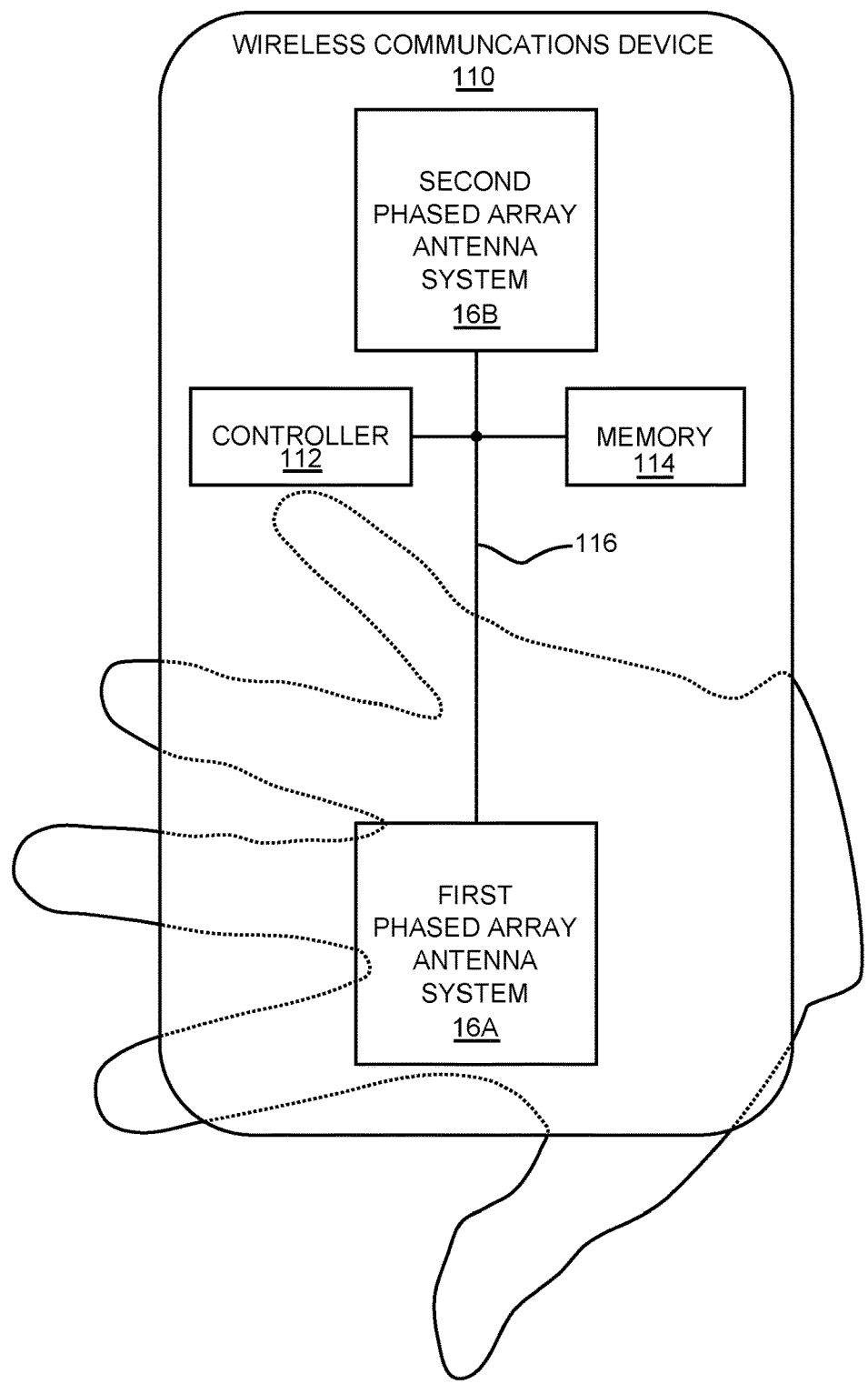
FIG. 5 is a diagram of an exemplary cellular handset having a controller that is configured to switch between a first phased array antenna system and a second phased array antenna system based upon flags generated by the overcurrent detector and/or the overvoltage detector depicted in FIG. 4.

In this regard, FIG. 5 is a diagram of an exemplary embodiment of a wireless communication device 110 having a controller 112 and memory 114 that is configured to switch between a first phased array antenna system 16A and a second phased array antenna system 16B based upon flags generated by the overcurrent detector 86 and/or the overvoltage detector 88 depicted in FIG. 4. The controller 112 may be a digital baseband processor typically found in cellular handsets. Moreover, the controller 112 may communicate with the memory 114, the first phased array antenna system 16A and the second phased array antenna system 16B over a communication bus 116 such as a radio frequency front-end bus.

In this example, a person's hand is hovering over the first phased array antenna system 16A, which causes a poor standing wave ratio to occur for at least some of the plurality of amplifier circuitries 20. As a result, each power amplifier 22 (FIG. 3) included in the first phased array antenna system 16A may experience excess voltage and excess current. During operation, the controller 112 polls states for high current signal flag signals, high negative voltage flag signals $V_{HIGHN}$, and high positive voltage flag signals $V_{HIGHP}$ for each of the plurality of amplifier circuitries 20 of each of the first phased array antenna system 16A and the second phased array antenna system 16B. The controller 112 stores the states in memory locations of the memory 114 corresponding to the first phased array antenna system 16A and the second phased array antenna system 16B. Afterwards, the controller 112 examines the states, which can be logic 0 for no excess current and/or voltage or logic 1 for excessive current and/or voltage and determine whether communication transmissions should be switched from the first phased array antenna system 16A to the second phased array antenna system 16B. The controller 112 continuously polls, stores, and determines from the states stored in the memory 114 which of the first phased array antenna system 16A or the second phased array antenna system 16B will have a better transmit performance and switches to the one determined to have a better potential transmit performance. For example, the controller 112 would switch back to the first phased array antenna system 16A if the person's hand shifted from covering the first phased array antenna system 16A to covering the second phased array antenna system 16B.

Figure 6:
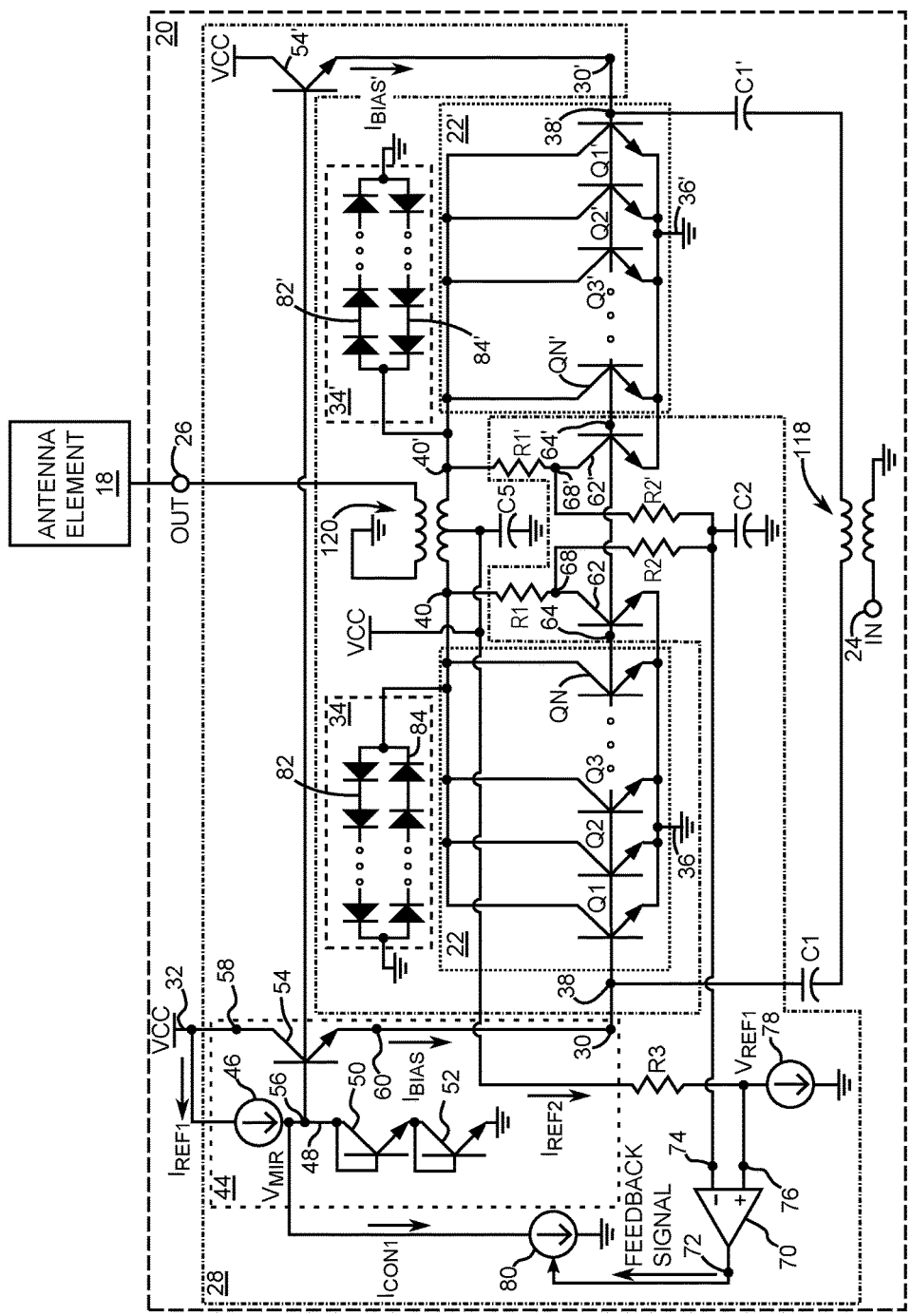
FIG. 6 is a schematic of an embodiment of a differential version of each one of the plurality of amplifier circuitries in accordance with the present disclosure.

FIG. 6 is a schematic of an exemplary embodiment of a differential version of each one of the plurality of amplifier circuitries 20 having the current limiter 28 and voltage limiter 34 and a voltage limiter 34' in accordance with the present disclosure. Like elements depicted in FIG. 6 with element numbers having a prime symbol are duplicates of elements having the same element number without a prime symbol. For example, a power amplifier 22' is a duplicate of the power amplifier 22. In the exemplary embodiment of the differential version of each one of the plurality of amplifier circuitries 20, a first RF transformer 118 couples the input terminal 24 to the control terminals 38 and 38' of the power amplifiers 22 and 22', respectively. A second RF transformer 120 couples the first current terminals 40 and 40' for the power amplifiers 22 and 22' to the output terminal 26. A fifth capacitor C5 couples from a center tap of a primary side of the second RF transformer 120 to ground to provide filtering for the second reference current $I_{REF2}$.

During operation, excessive current flow through the power amplifier 22 and/or the power amplifier 22' causes collector voltage of the sense transistor 62 and/or a sense transistor 62' to drop and results in the sense voltage $V_{SEN}$ dropping below the first reference voltage $V_{REF1}$. In response, the feedback signal output from the feedback output terminal 72 transitions from a lower value to a higher value. The higher value of the feedback signal causes a control current $I_{CON1}$ that flows through the third current source 80 to increase. In turn, the mirror voltage $V_{MIR}$ decreases as a smaller portion of the first reference current $I_{REF1}$ flows through the first diode-connected transistor 50 and the second diode-connected transistor 52. In response to the lower mirror voltage $V_{MIR}$, the bias transistors 54 and 54' lower the bias current $I_{BIAS}$ and a bias current $I_{BIAS}'$, which lowers the operating point of the power amplifier 22 and the power amplifier 22' to limit the current flowing through the power amplifier 22 and the power amplifier 22' to a predetermined safe level. The value to which the current flowing through the power amplifier 22 and the power amplifier 22' is limited is relatively easily set by the resistance value chosen for the third resistor R3. A voltage limiter 34' operates identical to the voltage limiter 34. Moreover, the differential version of each one of the plurality of amplifier circuitries 20 may further include the overcurrent detector 86 and the overvoltage detector 88 depicted in FIG. 4.

Those skilled in the art will recognize improvements and modifications to the preferred embodiments of the present disclosure. All such improvements and modifications are considered within the scope of the concepts disclosed herein and the claims that follow.

What is claimed is:

1. A phased array antenna system comprising:
   a plurality of antenna elements arranged into an array; and
   a plurality of amplifier circuitries, each of the plurality of amplifier circuitries comprising:
      an input terminal;
      an output terminal coupled to a corresponding one of the plurality of antenna elements;
      a power amplifier having a control terminal coupled to the input terminal and a first current terminal coupled to the output terminal and a second current terminal coupled to a fixed voltage node; and
      a current limiter having a bias terminal coupled to the control terminal of the power amplifier to adjust a bias point of the power amplifier to limit current flowing through the first current terminal and the second current terminal to within a predetermined current range.

2. The phased array antenna system of claim 1 wherein the current limiter comprises:
   current feedback circuitry having a current sense input coupled to the first current terminal and a current sense output terminal, wherein the current feedback circuitry is configured to generate a current sense signal that is proportional to current flowing through the output terminal of the power amplifier and provide the current sense signal at the current sense output terminal; and
   bias circuitry having a current feedback terminal coupled to the current sense output terminal, wherein the bias circuitry is configured to adjust the bias point of the power amplifier to limit current flowing through the first current terminal to within the predetermined current range in response to the current sense signal.

3. The phased array antenna system of claim 1 wherein the current limiter further includes an overcurrent detector configured to generate an overcurrent flag signal at an overcurrent flag terminal for providing the overcurrent flag signal to external circuitry.

4. The phased array antenna system of claim 1 further comprising a voltage limiter coupled between the output terminal and the fixed voltage node to limit voltage amplitude at the output terminal to within a predetermined voltage range.

5. The phased array antenna system of claim 4 wherein the voltage limiter comprises a first branch of series-connected diodes coupled in anti-parallel with a second branch of series-connected diodes.

6. The phased array antenna system of claim 4 wherein the voltage limiter further includes an overvoltage detector configured to generate a positive overvoltage flag signal at a positive overvoltage flag terminal and a negative overvoltage flag signal at a negative overvoltage flag terminal for providing the negative overvoltage flag signal and the positive overvoltage flag signal to external circuitry.

7. The phased array antenna system of claim 4 wherein the current limiter further includes an overcurrent detector configured to generate an overcurrent flag signal at an overcurrent flag terminal for providing the overcurrent flag signal to the external circuitry.

8. The phased array antenna system of claim 1 wherein the power amplifier comprises a plurality of bipolar junction transistors coupled in parallel and configured to amplify radio frequency (RF) signals having wavelengths between 3 centimeters and 15 centimeters.

9. The phased array antenna system of claim 1 wherein each of the plurality of amplifier circuitries further includes a second power amplifier having a second control terminal coupled to the input terminal and a third current terminal coupled to the output terminal and a fourth current terminal coupled to the fixed voltage node.

10. The phased array antenna system of claim 1 wherein the fixed voltage node is ground.

* * * * *